(12) United States Patent
Wimpenny

(10) Patent No.: US 9,608,445 B2
(45) Date of Patent: *Mar. 28, 2017

(54) FILTER FOR SWITCHED MODE POWER SUPPLY

(71) Applicant: SNAPTRACK, INC., San Diego, CA (US)

(72) Inventor: Gerard Wimpenny, Cambridge (GB)

(73) Assignee: SnapTrack, Inc., San Diego, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 14/515,966

(22) Filed: Oct. 16, 2014

(65) Prior Publication Data

US 2015/0054598 A1 Feb. 26, 2015

Related U.S. Application Data

(63) Continuation of application No. 12/919,645, filed as application No. PCT/EP2009/052399 on Feb. 27, 2009, now Pat. No. 8,879,284.

(30) Foreign Application Priority Data

Feb. 29, 2008 (GB) .................................. 0803820.0

(51) Int. Cl.
*H02J 3/01* (2006.01)
*H03H 7/01* (2006.01)
(Continued)

(52) U.S. Cl.
CPC .............. *H02J 3/01* (2013.01); *H03F 1/0216* (2013.01); *H03F 1/0222* (2013.01); *H03F 3/19* (2013.01); *H03F 3/21* (2013.01); *H03F 3/217* (2013.01); *H03H 7/0115* (2013.01); *H03H 7/0138* (2013.01); *H03H 7/075* (2013.01); *H03H 7/1766* (2013.01); *H03H 7/1775* (2013.01);
(Continued)

(58) Field of Classification Search
CPC .......... H03H 7/06; H03H 7/38; H03H 7/1766; H02J 3/01
USPC .... 333/17.3, 32, 124, 172, 174, 175; 363/39
See application file for complete search history.

(56) References Cited

U.S. PATENT DOCUMENTS 3,461,372 A 8/1969 Pickup et al.
4,027,225 A 5/1977 Elvin
(Continued)

FOREIGN PATENT DOCUMENTS

EP 0316892 A2 5/1989
JP 59172822 A 9/1984
(Continued)

OTHER PUBLICATIONS

Hua Bai, "Chinese Patent Application No. 200980106935.5 Office Action", Jun. 20, 2012, Publisher: State Intellectual Porperty Office of China, Published in: CN.
(Continued)

*Primary Examiner* — Stephen E Jones
*Assistant Examiner* — Rakesh Patel

(57) ABSTRACT

There is provided a filter for receiving a rectangular or stepped source voltage to be filtered and for providing an output voltage, the filter including means arranged to determine the output voltage in dependence on the frequency components of the source voltage within the filter passband, and independent of output current drawn.

17 Claims, 6 Drawing Sheets

(51) Int. Cl.
*H03F 1/02* (2006.01)
*H03F 3/217* (2006.01)
*H03F 3/19* (2006.01)
*H03F 3/21* (2006.01)
*H03H 7/075* (2006.01)

(52) U.S. Cl.
CPC .. *H03F 2200/102* (2013.01); *H03F 2200/165* (2013.01)

(56) References Cited

U.S. PATENT DOCUMENTS

| | | | |
|---|---|---|---|
| 4,215,325 | A | 7/1980 | Sansone |
| 4,349,795 | A | 9/1982 | Kwok |
| 4,456,985 | A | 6/1984 | Carsten et al. |
| 4,600,891 | A | 7/1986 | Taylor, Jr. et al. |
| 5,095,285 | A | 3/1992 | Khatibzadeh |
| 5,363,068 | A | 11/1994 | Georger |
| 5,377,092 | A | 12/1994 | Rowand et al. |
| 6,064,266 | A | 5/2000 | Anderson et al. |
| 6,348,781 | B1 | 2/2002 | Midya et al. |
| 6,788,168 | B2 | 9/2004 | Guitton et al. |
| 7,164,331 | B2 | 1/2007 | Reddy |
| 7,633,773 | B2 | 12/2009 | Chen |
| 8,879,284 | B2 | 11/2014 | Wimpenny |
| 2005/0282503 | A1 | 12/2005 | Onno et al. |
| 2006/0148474 | A1 | 7/2006 | Reddy |
| 2006/0178119 | A1 | 8/2006 | Jarvinen |
| 2007/0057721 | A1 | 3/2007 | Risbo et al. |
| 2012/0268440 | A1* | 10/2012 | Yun ............... H03H 9/02062 345/211 |

FOREIGN PATENT DOCUMENTS

| | | | |
|---|---|---|---|
| JP | 60-74809 | A | 4/1985 |
| JP | 62064255 | A | 3/1987 |

OTHER PUBLICATIONS

"British Search Report for International Application No. GB 0803820.0", "UK Intellectual Property / British Patent Office", May 26, 2008, Publisher: GB, Published in: South Wales.

"International Search Report and Written Opinion for International Application No. PCT/EP2009/052399", Feb. 29, 2008, Publisher: PCT International Searching Authority / European Patent Office, Published in: Netherlands.

"Related U.S. Appl. No. 12/919,645", "NonFinal Office Action", Apr. 9, 2013, Publisher: USPTO, Published in: US.

"Related U.S. Appl. No. 12/919,645", "Notice of Allowance", Jul. 8, 2014, Publisher: USPTO, Published in: US.

"Related U.S. Appl. No. 12/919,645", "Final Office Action", Nov. 8, 2014, Publisher: USPTO, Published in: US.

"International Search Report and Written Opinion for International Application No. PCT/EP2009/052399", Dated: May 26, 2009, Publisher: PCT International Searching Authority I European Patent Office, Published in: Netherlands.

* cited by examiner

FILTER FOR SWITCHED MODE POWER SUPPLY

CROSS-REFERENCE TO RELATED APPLICATION(S)

This application is a Continuation of U.S. patent application Ser. No. 12/919,645, incorporated herein by reference.

U.S. patent application Ser. No. 12/919,645 is a 35 U.S.C. 371 filing of International Application Number PCT/EP2009/052399, filed on Feb. 27, 2009, which in turn claims priority to Great Britain Application Number 0803820.0, filed on Feb.29, 2008, incorporated herein by reference.

BACKGROUND TO THE INVENTION

Field of the Invention

The present invention relates to the filtering of a voltage in an arrangement in which the voltage is a stepped or rectangular voltage. The invention is particularly but not exclusively concerned with the filtering of a supply voltage in a switched mode power supply.

Description of Related Art

Modulated power supplies are used, for example, for providing a supply voltage to an amplification stage, typically a radio frequency (RF) amplification stage. An example of a particularly advantageous modulated power supply stage can be found in United Kingdom Patent No. 2398648.

In general, modulated power supplies provide a technique for tracking the supply voltage to an RF amplifier in dependence upon the RF input signal to be amplified by the amplifier. Such modulated power supply stages may typically be provided with a plurality of power supply voltages, one of which is selected in dependence upon a current level of the signal to be amplified. Thus there is provided a switching block which switches between one of a plurality of available power supplies to deliver a suitable power supply voltage to the RF amplifier.

In typical applications the output of the switching block is provided with a filter for filtering the selected voltage supply.

This filter gives rise to certain problems. Losses in the switching device may occur as a result of the filter input current being drawn through the "on" resistance of the switching devices. This input current comprises an unavoidable DC term due to the output load (e.g. the RF amplifier) being driven through the filter, and a "ripple" current determined by the filter input impedance.

In addition to these losses which occur in a switching device as a result of the connection of its output to the filter, there are also losses as a result of the filter itself.

These losses incurring in the filter and as a result of the filter cause variations to the output voltage delivered to the load from the filter. This is disadvantageous.

It is thus an aim of the present invention to provide an improved arrangement for filtering a stepped or rectangular voltage such as found in a modulated power supply.

SUMMARY OF THE INVENTION

A key performance metric for a dynamically modulated switch mode power supply is voltage tracking accuracy, i.e. the difference between a desired and an actual output voltage. This is directly influenced by the output impedance/load current combination. A typical filter results in large voltage resonances in the filter transition region as a consequence of output impedance peaks. In accordance with the invention there is provided a means for reducing the impedance peaks to thereby control the resonances.

The invention provides a filter for receiving a rectangular or stepped source voltage to be filtered, the filter being arranged to provide a reduced output impedance whilst maintaining an appropriate input impedance. The output impedance is preferably reduced across the full frequency range, the input impedance being maintained across the full frequency range. In particular the input impedance may be increased above a level which would otherwise be achieved as a result of reducing the output impedance.

In accordance with the invention there is provided a filter for receiving a rectangular or stepped source voltage to be filtered and for providing an output voltage, the filter including means arranged to determine the output voltage in dependence on the frequency components of the source voltage within the filter passband, and independent of output current drawn.

The means may be arranged to provide reduced impedance at the output of the filter across the filter transition band.

The the means may be arranged to provide an impedance at the output of the filter at the filter transition band which approximates to the impedance at the output of the filter at the passband.

The means may be arranged to provide a low impedance at the output of the filter at the passband, transition band, and stop band.

The means may include a lossy resistance means. The means may include a resistor connected in parallel across part of the input inductor of the filter. In other words, the input inductor may be split into two parts, with the resistor connected in parallel across one part. The filter may be a $j^{th}$ order filter, and a further resistor may be placed across the inductor of each further order of the filter.

The impedance of all elements within the filter may be reduced by a factor n, in order to further reduce the output impedance of the filter stage.

The filter may be a $j^{th}$ order filter, and the means may be arranged to reduce the impedance of the inductor and capacitor in one or more orders of the filter. To achieve the reduction, the inductance of the inductor may be divided by a value n and the capacitance of the capacitor may be multiplied by a value n.

This modification to the filter, however, also reduces the filter input impedance and hence increases the static losses in the switching devices. This effect may be counteracted, in a preferred modification, by splitting the input inductor into several sections to create parallel resonance circuits at the switching frequency and its odd harmonics. This may be achieved in the preferred arrangement by splitting the input inductor into k sections. Each of the k sections preferably includes a parallel arrangement of an inductor, a capacitor and a resistor.

Where the means is arranged such that if part of the input inductor is split into a series of parallel resonant circuits, the input impedance is increased relative to the value it would have had if the elements of each stage of the filter where not split.

The means may include at least one output trap at the output of the filter, each output trap including an inductance having a low Q factor. The at least one output trap may include an inductor and a capacitor connected in series.

A modulated power supply stage may include a filter as described herein. An RF amplification stage may include such a filter.

Advantageously the invention suppresses output impedance peaks which occur in the transition band of conventional filters. These impedance peaks result in voltage peaks at the filter output when the load current frequency lies in the filter transition band. The impedance peak suppression is achieved in accordance with the invention without unduly comprising other filter design parameters such as input impedance, loss, and transfer function.

In accordance with embodiments invention provides a filter topology which allows simultaneous attainment of the following design goals for a switched mode power supply output filter:

a low output impedance across pass band, transition band and stop band;
b high input impedance at the fundamental and odd harmonics of the switching frequency;
c low pass band amplitude and group delay ripple;
d low dissipation when driven with switching waveform; and
e low output voltage ripple at the switching frequency.

The filter topology contains several features, in a particularly preferred implementation, to permit simultaneous attainment of the design goals. A first feature is the use of resistors to introduce loss at selected frequencies. A second feature is parallel resonant input sections to raise input impedance at the fundamental and odd harmonics of the switching frequency. A third feature is the use of low Q-factor series resonant output sections to reduce output impedance at selected frequencies.

The invention also provides a filter for receiving or filtering a rectangular or stepped source voltage and for providing an output voltage, the filter including at least one lossy resistance means. The filter may be arranged to provide a reduced output impedance whilst maintaining an appropriate input impedance.

BRIEF DESCRIPTION OF THE FIGURES

The present invention in now described by way of example with reference to the accompanying Figures, in which.

DESCRIPTION OF PREFERRED EMBODIMENTS

The present invention is described herein by way of particular examples and specifically with reference to preferred embodiments. It will be understood by one skilled in the art that the invention is not limited to the details of the specific embodiments given herein. In particular the invention is described herein by way of reference to an RF amplification stage including a switched mode voltage supply. However more generally the invention may apply to any arrangement where it is necessary to filter a rectangular or stepped drive signal.

Figure 1:
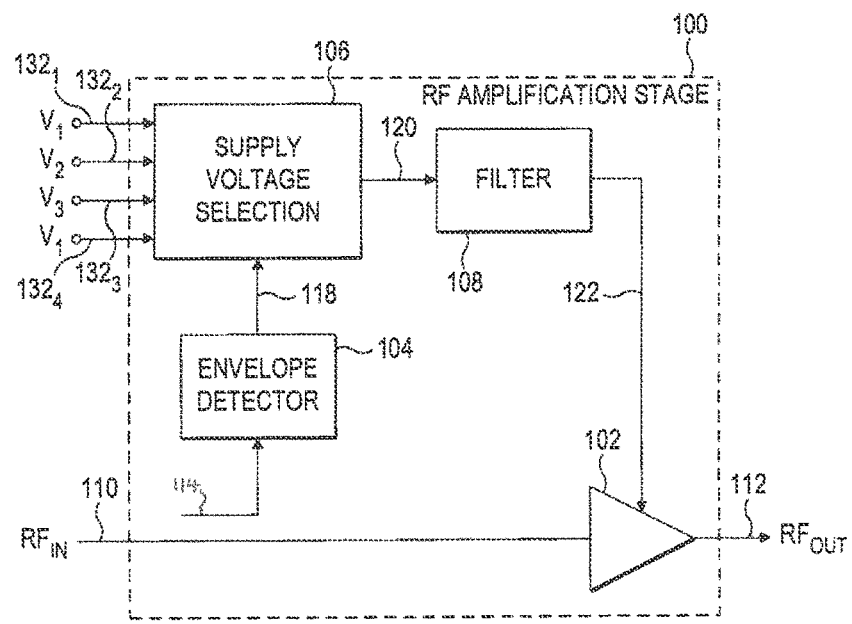
FIG. 1 illustrates a block diagram of an RF amplification stage embodying the concept of the present invention.

Referring to FIG. 1, there is illustrated an RF amplification stage 100 in accordance with an exemplary application for describing the present invention. The RF amplification stage 100 includes an RF amplifier 102, a supply voltage selection block 106, an envelope detector 104, and a filter 108.

In the illustrated example of FIG. 1, the supply voltage selection block 106 receives four supply voltages $V_1$-$V_4$ on respective input lines $132_1$-$132_4$. In general, however, a supply voltage selection block may select between any number of levels, four being a non-limiting example. The selected supply voltage is output from the supply voltage selection block 106 on line 120. The RF amplification stage 100 receives an RF input signal $RFT_{IN}$ on line 110. The envelope detector 104 has an input 114 coupled to line 110 to thereby detect the RF input signal. The envelope detector provides an output on line 118 to the supply voltage selection block 106 to provide the necessary information for the supply voltage selection to take place. The filter 108 receives the output of the supply voltage selection block on line 120. The filter 108 provides a filtered supply voltage on line 122 for the RF amplifier 102. The RF amplifier 102 provides on line 112 the RF output signal $RF_{OUT}$.

The example arrangement of FIG. 1 is illustrative, and the invention is not limited to any details shown. For example elements of the illustrative RF amplification stage of FIG. 1, specifically the envelope detector 104, the supply voltage selection block 106 or the filter 108, may be implemented in the digital domain in an alternative arrangement.

In general, given a selection of the desired supply voltage for the RF input signal to be amplified, the supply voltage selection block 106 connects the selected supply voltage to its output on line 120. The filter 108 functions to filter the supply voltage on line 120 to the RF amplifier 102.

Figure 2:
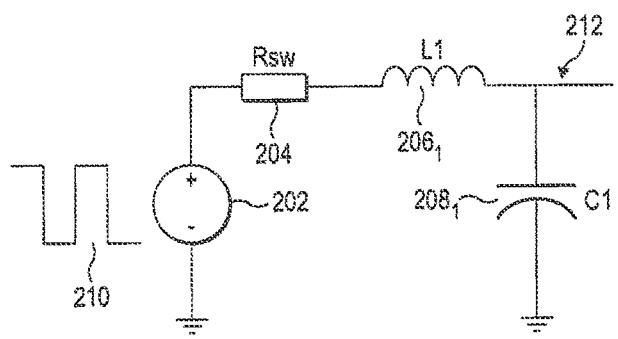
FIG. 2 illustrates a conventional filter arrangement.

FIG. 2 illustrates an equivalent circuit for the supply voltage selection block 106 and a conventional arrangement for the filter 108. The filter 108 receives a rectangular drive voltage, as represented by the voltage waveform 210, which is provided by voltage source 202 in the equivalent circuit arrangement of FIG. 2. The rectangular drive voltage is provided by semiconductor switches with low "on" resistance, represented by resistance $R_{SW}$ in FIG. 2 and denoted by reference numeral 204. The filter circuitry is provided by an inductor $206_1$, having an inductance value L1 and a capacitor $208_1$ having a capacitance value C1. The filter substantially removes frequency components at the switching frequency and the associated harmonics, leaving only the DC components of the input waveform. The output DC voltage provided on output line 212 is then determined by the duty cycle of the input switching waveform.

Dynamic modulation of the output voltage provided on the output line 212 may be obtained by varying the duty cycle of the input waveform. The duty cycle of the input waveform may be varied by varying the pulse width of the input waveform, the repetition rate of the pulse, or both. The modulation bandwidth and switching frequency residual ripple are both determined by the design of the output filter 108.

Figure 3:
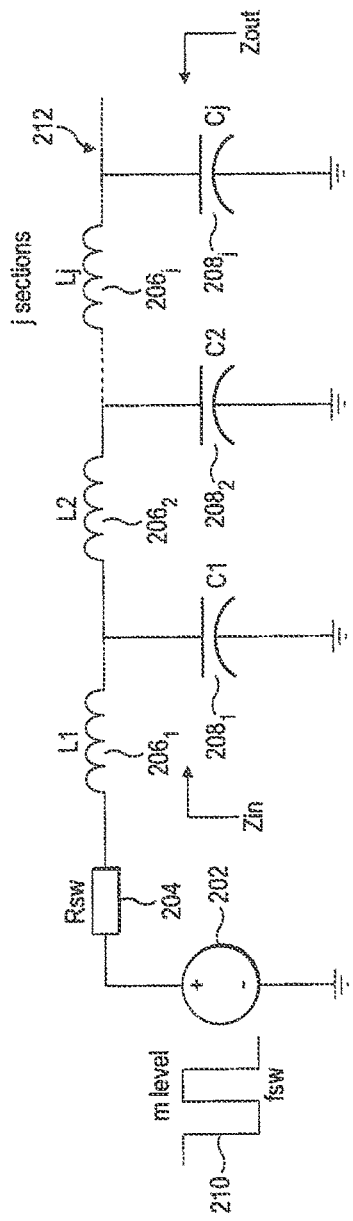
FIG. 3 illustrates a conventional multi-stage filter arrangement.

The maximum tracking bandwidth for a given switching frequency and output ripple may be increased by adding additional sections to the filter, as shown in FIG. 3. As shown in FIG. 3, additional inductor-capacitor pair arrangements are added to the filter arrangement of FIG. 2, in order to provide a higher order filter. As shown in FIG. 3 a second stage or section comprising an inductor $206_2$ having an inductance value L2 and a capacitor $208_2$ having a capacitance value C2 are added, and in general a $j^{th}$ stage is added by an inductor $206_j$ having an inductance value Lj and a capacitor $208_j$ having a capacitance value Cj.

The input switching waveform may in general be regarded as a m-level quantised representation of the desired output waveform. High order quantisation results in reduced quantisation noise and hence reduced filtering requirements.

The efficiency of the supply voltage selection stage 106 is determined by losses in the switching devices within the selection stage 106 and losses in the output filter 108, as set out in the background section above. The losses within the switching devices may further be classified into "static" and "dynamic" or switching losses. The static losses occur as a result of a filter input current being drawn through the "on" resistance of the switching devices. The input current comprises an unavoidable DC term due to the output load and a "ripple" current determined by the filter input impedance. The ripple current is determined by the filter input impedance at the switching frequency and its odd harmonics. Hence for high efficiency the filter should present high impedance at these frequencies.

Ideally, it is desired for the voltage provided at the filter output to be determined solely by the source voltage and to be independent of the output current drawn. To approach this ideal, in accordance with embodiments of the present invention, a filter arrangement is provided in which the output impedance is low across the filter pass band, transition band, and stop band.

Achieving low output impedance at the transition band is more difficult than in the pass band and stop band. Typically the transition band shows large impedance peaks due to resonances within the filter. If the spectrum of the load current is a white noise spectrum, then large errors in output voltage will occur at the frequencies of resonance.

There is now described three embodiments for implementing the present invention. Each embodiment, on its own, offers a solution to reduce the output impedance of the filter in the transition band, and thereby make the output voltage of the filter less dependent on the output current drawn. The embodiments may be utilised individually or in any combination.

Figure 4:
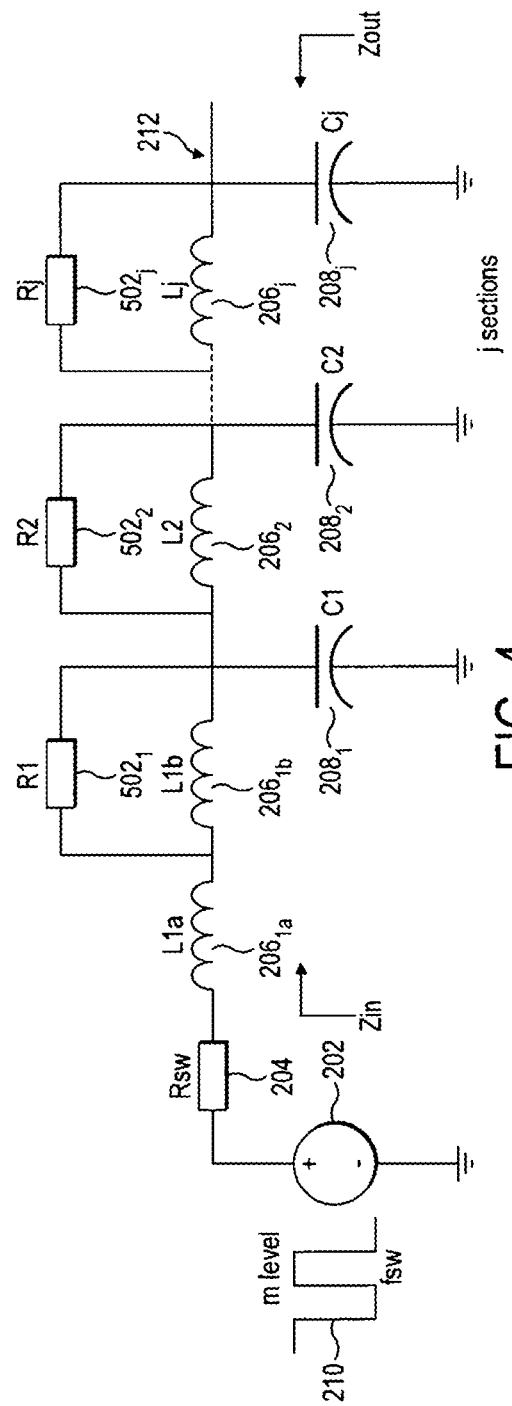
FIG. 4 illustrates an improved filter arrangement according to a first embodiment of the invention.

The first embodiment of the invention is shown in FIG. 4. In this first embodiment the magnitude of the impedance peaks is reduced by introducing at least one lossy resistive element into the filter. The lossy resistive elements are chosen so as to introduce loss at the resonance peaks without significantly increasing the passband loss of the filter, or the loss at the switching frequency and its harmonics.

A resistor is preferably provided for each inductor in each order of the filter.

Whilst the filter of FIG. 4 is adapted to achieve a reduced output impedance, it is important to ensure that the input impedance of the filter is not adversely affected, and particularly that the input impedance is not reduced. A reduction in the filter input impedance increases the static losses in the switching devices, which is undesirable.

To ensure the input impedance is not reduced, for the first section of a $j^{th}$ filter, or in a first order filter, the inductor is split such that the resistor is connected in parallel across only a part of the inductor. Thus as shown in FIG. 4 the inductor $206_1$ of FIG. 3 is split into a first part $206_{1a}$ having an inductance value L1a and a second part $206_{1b}$ having an inductance value L1b. A lossy resistor $502_1$ having a value R1 is connected in parallel across the inductor $206_{1b}$. The inductor $206_{1a}$ ensures that the input impedance of the filter, Zin, remains high at the switching frequency and its harmonics.

As also shown in FIG. 4 for a $j^{th}$ order filter each inductor of each filter stage, other than the inductor of the first stage, has a resistor connected in parallel across it. The inductor $206_2$ is thus shown to have a resistor $502_2$ having a resistance value R2 connected across it, and the inductor $206_j$ is shown to have a resistor $R_j$ $502_j$ having a resistance value $R_j$ connected across it.

In this first embodiment, when applied to a $j^{th}$ order filter, advantages are obtained by connecting a lossy resistor across the inductor of one or more stages. It is not essential to connect a lossy resistor across all stages.

Using the exemplary technique of FIG. 4, the output impedance is maintained low across the passband, transition band and stopband of the filter, i.e. across the full frequency range.

Figure 5:
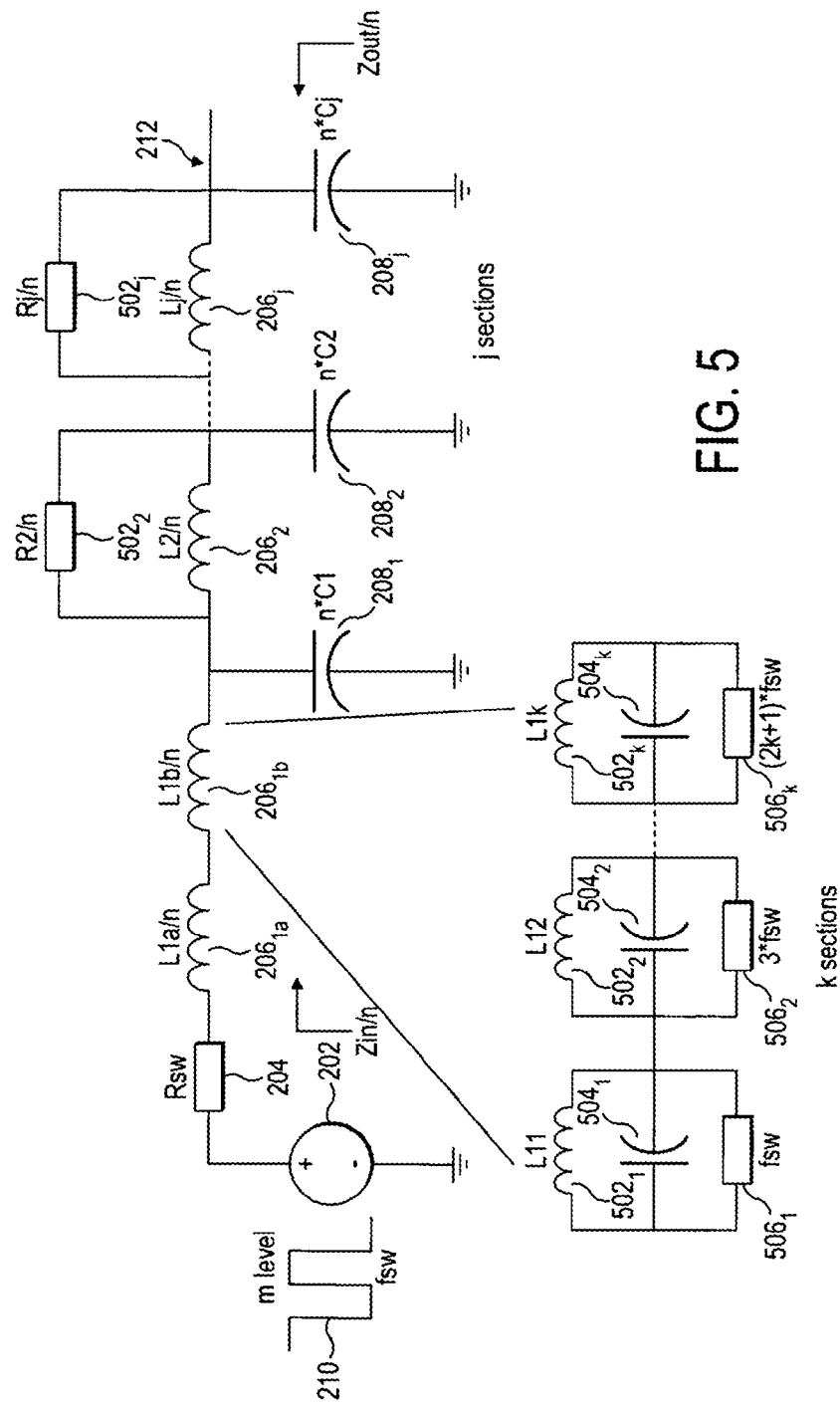
FIG. 5 illustrates an improved filter arrangement according to the first and a second embodiment of the invention.

A second embodiment is described with reference to FIG. 5. The embodiment of FIG. 5 is shown by way of additional modification to the embodiment of FIG. 4. It should be understood, however, that the embodiment of FIG. 5 does not require to be implemented in combination with the embodiment of FIG. 4. The principles of the embodiment of FIG. 5 offer an improvement in themselves when implemented without the features of the first embodiment.

In accordance with the second embodiment, the impedance of all elements within the filter is reduced by a factor n, to further reduce the output impedance of the filter stage. This is illustrated in FIG. 5 by the notation of the values of all the inductors shown therein being divided by n, and similarly the values of the lossy resistors 502 in a multiple-order arrangement being divided by n. The capacitance values are multiplied by n.

This modification to the filter, however, whilst reducing the output impedance also reduces the filter input impedance.

This effect may be counteracted, in a preferred modification, by splitting the input inductor into several sections to create parallel resonance circuits at the switching frequency and its odd harmonics. This may be achieved in the preferred arrangement of FIG. 5 by splitting the input inductor $206_{1b}$ into k sections. As shown in FIG. 5 each of the k sections includes a parallel arrangement of an inductor 502, a capacitor 504 and a resistor 506.

The inductors $502_1$, $502_2$, $502_k$ in total have an inductance value equivalent to the value of the inductor $206_{1b}$.

This second embodiment is shown as an arrangement in combination with features of the first embodiment, where only a portion of the input inductance is modified.

Where the arrangement to implement counteraction of static losses is desired, i.e. to avoid a reduction of input impedance, and the arrangement of the first embodiment is not implemented, the input inductance $206_{1b}$ of FIG. 5 may still be split up into parallel resonance circuits as shown for the inductance $206_{1b}$ of FIG. 5.

Using the exemplary technique of FIG. 5, the output impedance is maintained low across the passband, transition band and stopband of the filter, i.e. across the full frequency range.

A third embodiment is illustrated with reference to FIG. 6. The principles of this third embodiment are again illustrated in combination with, the principles of the first embodiment described hereinabove, but they need riot be implemented in combination with the first embodiment.

Figure 6:
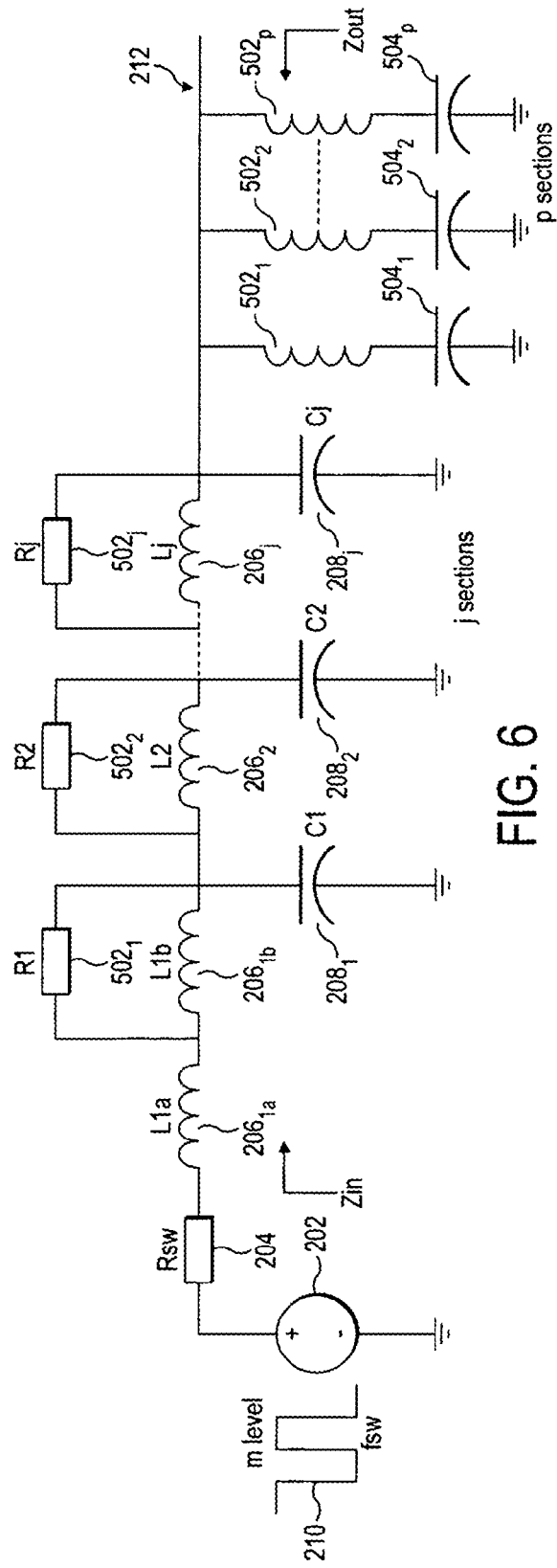
FIG. 6 illustrates an improved filter arrangement according to the first and a third embodiment of the invention.

In the third embodiment as illustrated by FIG. 6, a plurality p of "output traps" are utilised, each output trap including an inductor and capacitor connected in series to ground. Thus there is shown a first output trap comprising an inductor $502_1$ and capacitor $504_1$ connected in series; a second output trap comprising an inductor $502_2$ and a capacitor $504_2$ connected in series; and a $p^{th}$ output trap comprising an inductor $502_p$ and capacitor $504_p$ connected in series.

Figure 7:
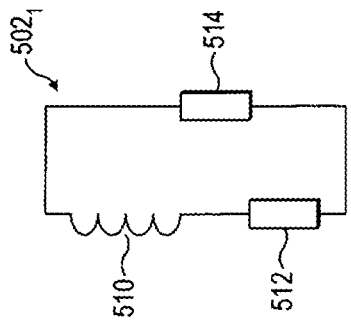
FIG. 7 illustrates a modification to the filter arrangement of FIG. 6.

The output traps each have a low Q factor. The Q factor of each inductor 502 in the output traps may be deliberately reduced through use of series and parallel resistors as shown in FIG. 7. Thus, for example, with reference to FIG. 7 the inductor $502_1$ may be implemented by an inductor 510 and resistor 512 in series, with a further resistor 514 connected across in parallel.

The output traps reduce the output impedance of the filter. The number of output traps, p, provided is dependent upon the number of frequency regions over which traps are required: each trap lowers the output impedance for a given frequency region.

In the above there is described a first embodiment with reference to FIG. 4, a second embodiment described in combination with the first embodiment with reference to FIG. 5, and a third embodiment described in combination with the first embodiment with reference to FIG. 6. Each embodiment may be utilised on its own or with any combination of the other embodiments. For completeness, a particularly preferred arrangement in which all three embodiments are combined is illustrated in FIG. 8.

Figure 8:
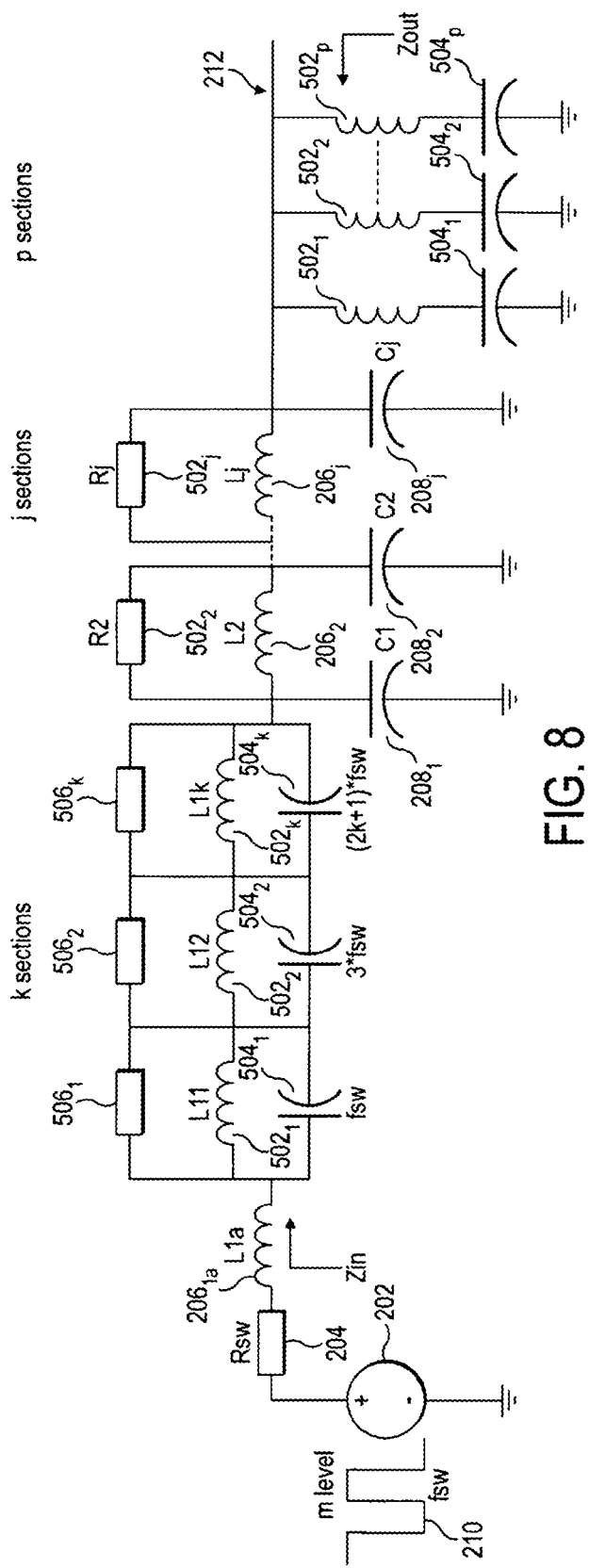
FIG. 8 illustrates a preferred filter implementation.

This preferred arrangement of FIG. 8 offers a particularly advantageous reduced output impedance. It should be noted that in the arrangement of FIG. 8 the principle of the second embodiment, in which the impedance values of the elements in the Figure are divided by a factor n, is only illustrated as implemented in the input stage of the filter, and not in subsequent orders of the filter. Thus each of the inductors $506_1$, $506_2$, $506_k$ combine to provide an inductance value which is an $n^{th}$ of the value of the inductor $206_{1b}$ of FIG. 4.

There is thus described three embodiments, exemplified by FIGS. 4, 5 and 6 respectively. The second embodiment is described with reference to FIG. 5, in combination with the first embodiment. Each embodiment may be implemented independently or in combination with any other embodiment.

However, whilst advantages in accordance with the invention can be achieved by implementing only the techniques of the second embodiment, it is preferable to implement the second embodiment in combination with either the first or third embodiment, The first and third embodiments have in common the provision of at least one lossy resistor. In the first embodiment the lossy resistor is provided in combination with the inductor of each order of the filter. In the second embodiment the lossy resistor is provided by one or more output traps. Thus in the preferred embodiment at least one lossy resistor is provided.

The present invention has been described herein by way of reference to particular preferred embodiments, and Particularly by way of reference to an application in a modulated voltage supply. This description is, however, only illustrative of examples. In particular the invention may be implemented more broadly.

What is claimed is:

1. A modulated power supply including a filter for receiving a source voltage to be filtered and for providing an output voltage, the filter including an inductor connected in parallel with a resistive element, wherein an output impedance of the filter with the resistive element is reduced across a filter transition band compared to the output impedance of the filter without the resistive element across the filter transition band.

2. The modulated power supply of claim 1, wherein the filter is configured to determine the output voltage in dependence on frequency components of the source voltage within a filter passband.

3. The modulated power supply of claim 1, wherein the filter is configured to reduce the output impedance without adversely affecting the input impedance of the filter.

4. The modulated power supply of claim 3, wherein the filter is configured to include a second resistive element connected in parallel across part of an input inductor of the filter.

5. The modulated power supply of claim 1, wherein the resistive element comprises a resistor.

6. The modulated power supply of claim 1, wherein the filter is configured to reduce the output impedance of an input inductor and an input capacitor.

7. The modulated power supply of claim 6, wherein the filter comprises a $j^{th}$ order filter, wherein the filter is configured to reduce the output impedance of the input inductor and the input capacitor in one or more orders of the filter.

8. The modulated power supply of claim 6, wherein the inductance of the input inductor is divided by a value n and the capacitance of the input capacitor is multiplied by the value n to reduce the output impedance.

9. The modulated power supply of claim 1, wherein the filter comprises one or more series resonant output traps at an output of the filter, each output trap having a low Q factor.

10. The modulated power supply of claim 9, wherein at least one of the series resonant output traps includes a resonant inductor and a capacitor connected in series.

11. An RF amplification stage including the modulated power supply according to claim 1.

12. The modulated power supply of claim 1, the filter further comprising a first stage having a second inductor and a second resistive element, wherein the second resistive element is connected in parallel across at least part of the second inductor of the first stage of the filter.

13. The modulated power supply of claim 12, wherein the second inductor of the first stage of the filter is split into a first part and a second part, and wherein the second resistive element is connected across the second part.

14. The modulated power supply according to claim 1, wherein the filter comprises a $j^{th}$ order filter, and wherein a second resistive element is placed across a second inductor of at least one order of the filter.

15. The modulated power supply of claim 1, wherein the filter is configured such that part of an input inductor therein is split into a series of parallel resonant circuits.

16. A modulated power supply including a filter for receiving a source voltage to be filtered and for providing an output voltage, the filter comprising a resistive element and an inductor, wherein the resistive element is connected in parallel across at least part of the inductor, and wherein the resistance of the resistive element reduces an output impedance of the filter at a passband, a transition band, and a stop band of the filter as compared to the output impedance of the filter without the resistance.

17. The modulated power supply of claim 16, wherein the filter is configured to reduce the output impedance without adversely affecting an input impedance of the filter.

* * * * *